United States Patent
Watanabe

(10) Patent No.: US 12,040,190 B2
(45) Date of Patent: Jul. 16, 2024

(54) SEMICONDUCTOR MANUFACTURING METHOD AND MANUFACTURING DEVICE OF EDGE LASER REMOVAL OF COMBINED SUBSTRATE

(71) Applicant: Kioxia Corporation, Tokyo (JP)

(72) Inventor: Takashi Watanabe, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 290 days.

(21) Appl. No.: 17/643,073

(22) Filed: Dec. 7, 2021

(65) Prior Publication Data

US 2022/0344159 A1    Oct. 27, 2022

(30) Foreign Application Priority Data

Apr. 22, 2021 (JP) .................. 2021-072536

(51) Int. Cl.
*H01L 21/268* (2006.01)
*B23K 26/57* (2014.01)
(Continued)

(52) U.S. Cl.
CPC ............ *H01L 21/268* (2013.01); *B23K 26/57* (2015.10); *H01L 21/7806* (2013.01); *B23K 2101/40* (2018.08)

(58) Field of Classification Search
CPC .... B23K 26/53; B23K 26/57; B23K 2101/40; B23K 26/0093; B23K 2101/36; B23K 2103/56; B23K 26/0823; B23K 26/361; B23K 28/02; B23K 26/38; B23K 26/402; H01L 21/268; H01L 21/7806; H01L 24/08; H01L 2224/05546; H01L 2224/05556;
(Continued)

(56) References Cited

U.S. PATENT DOCUMENTS 10,930,561 B2   2/2021  Sekiya
2016/0039044 A1* 2/2016  Kawaguchi ............ B23K 26/40
                                                  219/121.69
(Continued)

FOREIGN PATENT DOCUMENTS

JP    2004-111606 A    4/2004
JP    2020-35873 A     3/2020
(Continued)

*Primary Examiner* — John P. Dulka
(74) *Attorney, Agent, or Firm* — Oblon, McClelland, Maier & Neustadt, L.L.P.

(57) ABSTRACT

A device includes a first laser emitter, a second laser emitter, and a separating portion. The first laser emitter is configured to emit, in an outer circumferential portion of a bonded substrate including a first substrate and a second substrate bonded to each other, a first laser beam into the first substrate from a side of the first substrate to form a modified layer. The second laser emitter is configured to emit a second laser beam to a material layer that is arranged between the first substrate and the second substrate and is provided on the second substrate from a side of the second substrate, to cause peeling between the second substrate and the material layer. The separating portion is configured to separate an outer circumferential portion of the first substrate and an outer circumferential portion of the material layer from the outer circumferential portion of the bonded substrate.

12 Claims, 16 Drawing Sheets

(51) Int. Cl.
*B23K 101/40* (2006.01)
*H01L 21/78* (2006.01)

(58) Field of Classification Search
CPC . H01L 2224/80357; H01L 2224/80895; H01L 2224/80896; H01L 2224/94; H01L 24/80; H01L 25/18; H01L 25/50; H01L 21/67092; H01L 21/78; H01L 21/304; H01L 21/302
See application file for complete search history.

(56) References Cited

U.S. PATENT DOCUMENTS

| | | | |
|---|---|---|---|
| 2021/0039203 A1* | 2/2021 | Tanoue | ............ H01L 21/67092 |
| 2021/0242010 A1 | 8/2021 | Tanoue | |
| 2021/0296119 A1 | 9/2021 | Tanoue et al. | |

FOREIGN PATENT DOCUMENTS

| | | |
|---|---|---|
| JP | 2020-136448 A | 8/2020 |
| TW | 201939597 A | 10/2019 |
| WO | WO 2019/176589 A1 | 9/2019 |
| WO | WO 2019/208298 A1 | 10/2019 |
| WO | WO 2019/208359 A1 | 10/2019 |
| WO | WO 2020/017599 A1 | 1/2020 |

* cited by examiner

SEMICONDUCTOR MANUFACTURING METHOD AND MANUFACTURING DEVICE OF EDGE LASER REMOVAL OF COMBINED SUBSTRATE

CROSS REFERENCE TO RELATED APPLICATIONS

This application is based upon and claims the benefit of priority from the prior Japanese Patent Application No. 2021-072536, filed on Apr. 22, 2021, the entire contents of which are incorporated herein by reference.

FIELD

The embodiments of the present invention relate to a semiconductor manufacturing device and a manufacturing method of a semiconductor device.

BACKGROUND

A hybrid bonding technique has been developed which bonds a plurality of substrates with semiconductor elements formed thereon to each other. In the hybrid bonding technique, after bonding of the substrates, a trimming process for removing a portion of an outer circumferential portion (a round portion) of a bonded substrate is performed in order to prevent chipping of the bonded substrate.

However, when a device layer remains in the outer circumferential portion of the bonded substrate after the trimming process, the device layer may peel off the bonded substrate in subsequent processes such as a grinding process and a CMP (Chemical Mechanical Polishing) process, causing chipping or dust generation.

DETAILED DESCRIPTION

Figure 1:
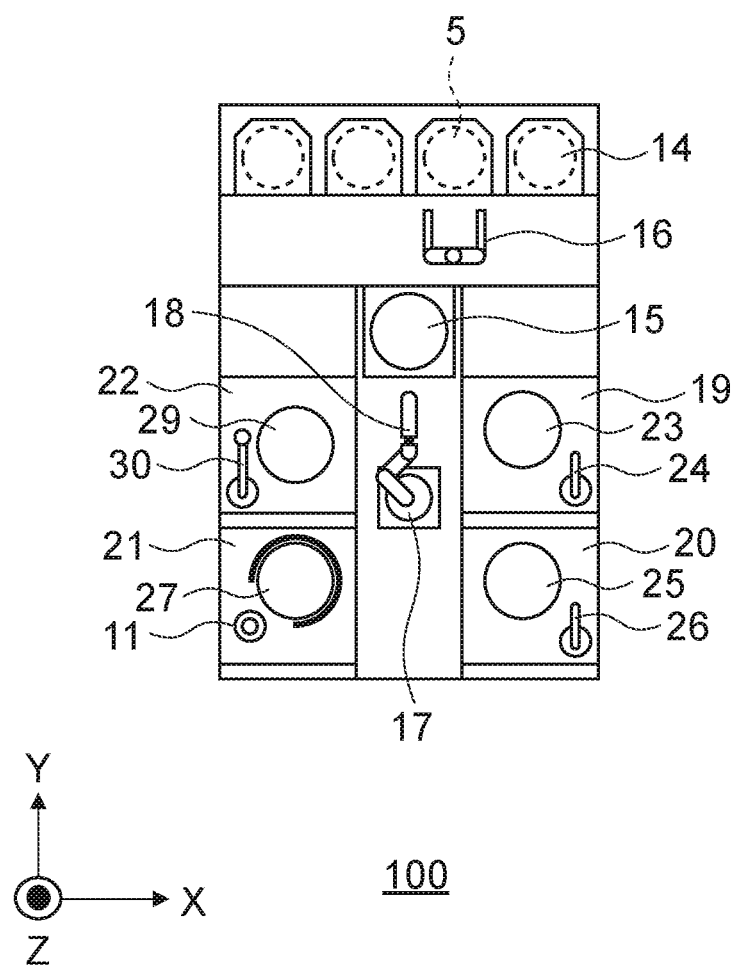
FIG. 1 is a plan view illustrating a configuration example of a semiconductor manufacturing device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor manufacturing device according to the present embodiment includes a first laser emitter, a second laser emitter, and a separating portion. The first laser emitter is configured to emit, in an outer circumferential portion of a bonded substrate including a first substrate and a second substrate bonded to each other, a first laser beam into the first substrate from a side of the first substrate to form a modified layer. The second laser emitter is configured to emit a second laser beam to a material layer that is arranged between the first substrate and the second substrate and is provided on the second substrate from a side of the second substrate, to cause peeling between the second substrate and the material layer. The separating portion is configured to separate an outer circumferential portion of the first substrate and an outer circumferential portion of the material layer from the outer circumferential portion of the bonded substrate.

First Embodiment

FIG. 1 is a plan view illustrating a configuration example of a semiconductor manufacturing device 100 according to a first embodiment. The semiconductor manufacturing device 100 includes a load port 14, a standby port 15, a first robot 16, a second robot 17, an inverting mechanism 18, a modified-layer forming unit 19, a peeling-layer forming unit 20, a separating unit 21, and a cleaning unit 22.

A wafer case for accommodating a bonded substrate 5 is set in the load port 14. The standby port 15 is a region on which the bonded substrate 5 that is to be processed next or the bonded substrate 5 after being processed is temporarily placed. The first robot 16 transfers the bonded substrate 5 between the wafer case in the load port 14 and the standby port 15. The second robot 17 includes the inverting mechanism 18 that sucks the bonded substrate 5 and turns it upside down.

The bonded substrate 5 is a substrate including a first substrate 2 and a second substrate 4 bonded to each other. Each of the first substrate 2 and the second substrate 4 is a semiconductor substrate, such as a silicon substrate. A semiconductor element such as a memory cell array (not illustrated) is formed on a surface of the first substrate 2. The memory cell array may be a three-dimensional memory cell array in which memory cells are arranged three-dimensionally. A semiconductor element such as a CMOS (Complementary Metal Oxide Semiconductor) circuit (not illustrated) is formed on a surface of the second substrate 4. The CMOS circuit may be, for example, a controller that controls the memory cell array on the first substrate 2.

The modified-layer forming unit 19 includes a first stage 23 that holds the bonded substrate 5 and a first laser emitter 24 that emits a first laser beam to the bonded substrate 5. The peeling-layer forming unit 20 includes a second stage 25 that holds the bonded substrate 5 and a second laser emitter 26 that emits a second laser beam to the bonded substrate 5. The separating unit 21 includes a third stage 27 and a separating blade 11. The third stage 27 holds the bonded substrate 5. The separating blade 11 is formed in a disk shape and is inserted between the first substrate 2 and the second substrate 4 to separate the outer circumferential portion of the first substrate 2 (see FIG. 6) of the bonded substrate 5 from the bonded substrate 5. The cleaning unit 22 includes a fourth stage 29 that holds the bonded substrate 5 and a two-fluid cleaning mechanism 30.

Figure 2:
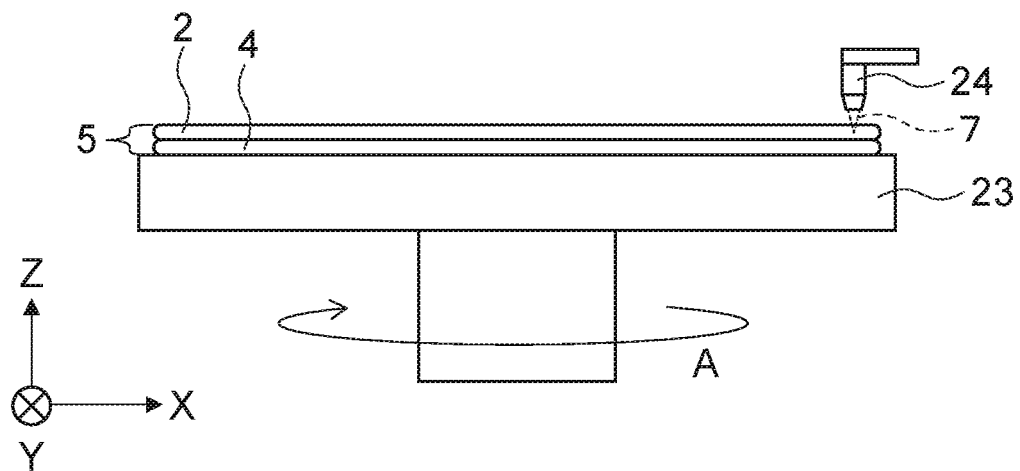
FIG. 2 is a schematic cross-sectional view illustrating a configuration example of a modified-layer forming unit.

FIG. 2 is a schematic cross-sectional view illustrating a configuration example of the modified-layer forming unit 19. The modified-layer forming unit 19 includes the first stage 23 and the first laser emitter 24.

The first stage 23 is configured to be able to hold the bonded substrate 5 and turn about a shaft as illustrated with an arrow A.

The first laser emitter 24 is configured to be movable to the outer circumferential portion of the bonded substrate 5 on the first stage 23 and emits a first laser beam 7 to the outer circumferential portion of the bonded substrate 5 from above the bonded substrate 5 in the Z-direction. The first laser beam 7 has a wavelength absorbed by the first substrate 2 (for example, a silicon substrate) of the bonded substrate 5.

Figure 3:
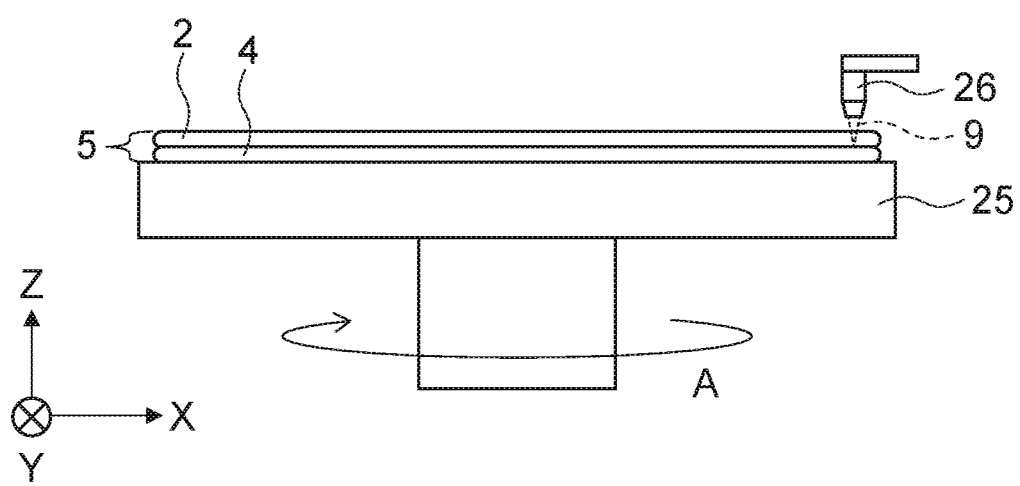
FIG. 3 is a schematic cross-sectional view illustrating a configuration example of a peeling-layer forming unit.

FIG. 3 is a schematic cross-sectional view illustrating a configuration example of the peeling-layer forming unit 20. The peeling-layer forming unit 20 includes the second stage 25 and the second laser emitter 26.

The second stage 25 is configured to be able to hold the bonded substrate 5 and turn about a shaft as illustrated with the arrow A.

The second laser emitter 26 is configured to be movable to the outer circumferential portion of the bonded substrate 5 on the second stage 25 and emits a second laser beam 9 to the outer circumferential portion of the bonded substrate 5 from above the bonded substrate 5 in the Z-direction. That is, the first and second laser emitters 24 and 26 respectively emit the first and second laser beams 7 and 9 to the bonded substrate 5 from the same direction (the Z-direction). The second laser beam 9 has a wavelength that passes through the second substrate 4 (for example, a silicon substrate) of the bonded substrate 5 and is absorbed by at least one layer (for example, a silicon oxide film) in a device layer provided between the first substrate 2 and the second substrate 4.

A memory cell array is covered with an insulating film, for example, a silicon oxide film on the first substrate 2. A CMOS circuit is covered with an insulating film, for example, a silicon oxide film on the second substrate 4. Any of a silicon oxide film, a silicon nitride film, a silicon carbide film, and a silicon carbonitride film is used as the insulating film. The device layer that configures a semiconductor element, such as the memory cell array or the CMOS circuit, and the insulating film that covers the semiconductor element are collectively called a material layer in the following descriptions.

FIGS. 4 to 7 are schematic cross-sectional views illustrating an example of a manufacturing method of a semiconductor device according to the first embodiment. A direction perpendicular to a mounting surface of each of the stages 23 and 25 is the Z-direction. One direction within the mounting surface of each of the stages 23 and 25 is assumed as the X-direction, and a direction perpendicular to the X-direction is assumed as the Y-direction.

First, the first robot 16 of the semiconductor manufacturing device 100 in FIG. 1 takes out the bonded substrate 5 from the wafer case 14 and places it on the standby port 15. The second robot 17 then places the bonded substrate 5 on the first stage 23 of the modified-layer forming unit 19 from the standby port 15. The bonded substrate 5 is placed on the first stage 23 with the first substrate 2 facing up in the Z-direction. In the modified-layer forming unit 19, the first stage 23 holds the bonded substrate 5 with the first substrate 2 facing up in the Z-direction, as illustrated in FIG. 4.

Figure 4:
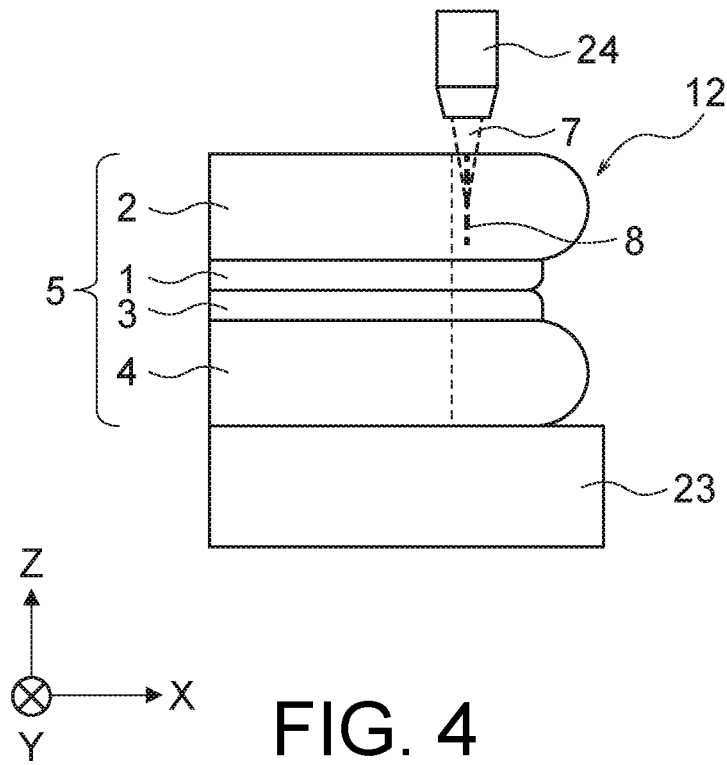
FIG. 4 is a schematic cross-sectional view illustrating an example of a manufacturing method of a semiconductor device according to the first embodiment.

Next, the first laser emitter 24 emits the first laser beam 7 to the outer circumferential portion of the first substrate 2 from the first substrate 2 side to form a modified layer 8 within the first substrate 2, as illustrated in FIG. 4. The modified layer 8 is formed to extend in a thickness direction of the first substrate 2 (the Z-direction). At this time, the first stage 23 rotates the bonded substrate 5 in the direction of the arrow A in FIG. 2, whereby the modified layer 8 is formed within the first substrate 2 over the entire outer circumferential portion of the first substrate 2.

Next, the second robot 17 picks up the bonded substrate 5 from the first stage 23 and places it on the second stage 25 of the peeling-layer forming unit 20 while inverting it by the inverting mechanism 18. The bonded substrate 5 is inverted and held on the second stage 25 with the second substrate 4 facing up.

Figure 5:
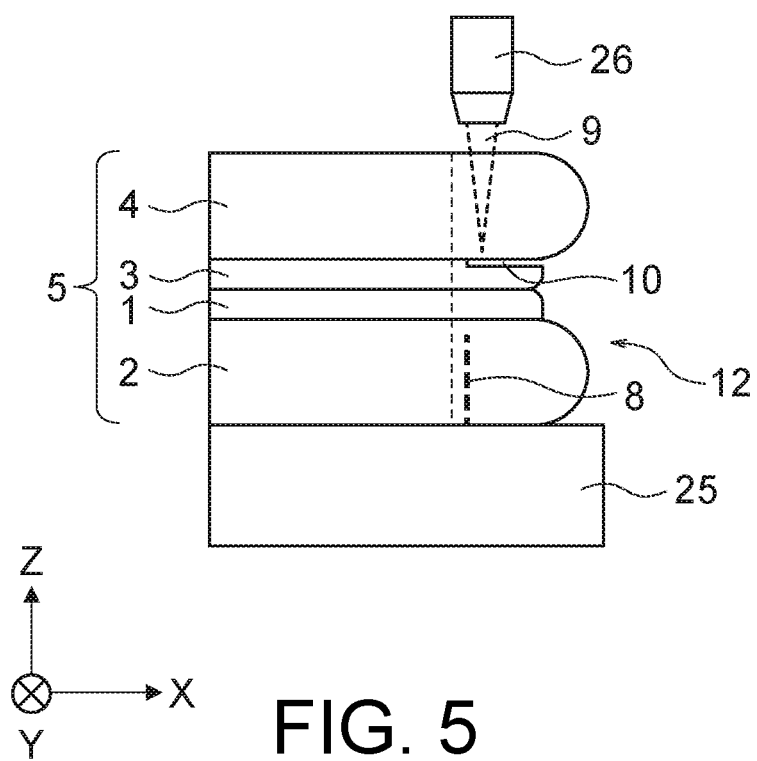
FIG. 5 is a schematic cross-sectional view illustrating an example of the manufacturing method of a semiconductor device in continuation from FIG. 4.

The second laser emitter 26 then emits the second laser beam 9 from the second substrate 4 side as illustrated in FIG. 5, thereby emitting the second laser beam 9 to a material layer 3 arranged between the first substrate 2 and the second substrate 4 and provided on the second substrate 4 from the second substrate 4 side. In this manner, the material layer 3 on the second substrate 4 absorbs the second laser beam 9 and is heated, so that peeling between the second substrate 4 and the material layer 3 or between films in the material layer 3 is caused to occur to form a peeling layer 10. At this time, the second stage 25 moves the second laser emitter 26 in the X-direction while rotating the bonded substrate 5 in the direction of the arrow A in FIG. 2, whereby the peeling layer 10 is formed over the entire outer circumferential portion of the second substrate 4.

Next, the second robot 17 in FIG. 1 picks up the bonded substrate 5 from the second stage 25 and places it on the third stage 27 of the separating unit 21 while inverting the bonded substrate 5 by the inverting mechanism 18. The bonded substrate 5 is inverted and held on the third stage 27 with the first substrate 2 facing up again.

Figure 6:
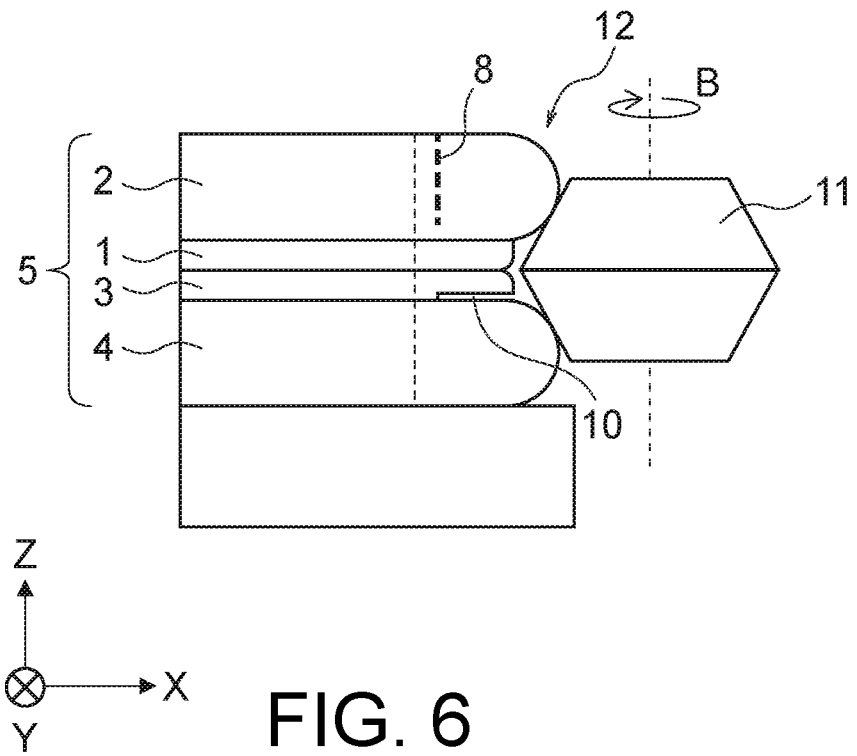
FIG. 6 is a schematic cross-sectional view illustrating an example of the manufacturing method of a semiconductor device in continuation from FIG. 5.
Figure 7:
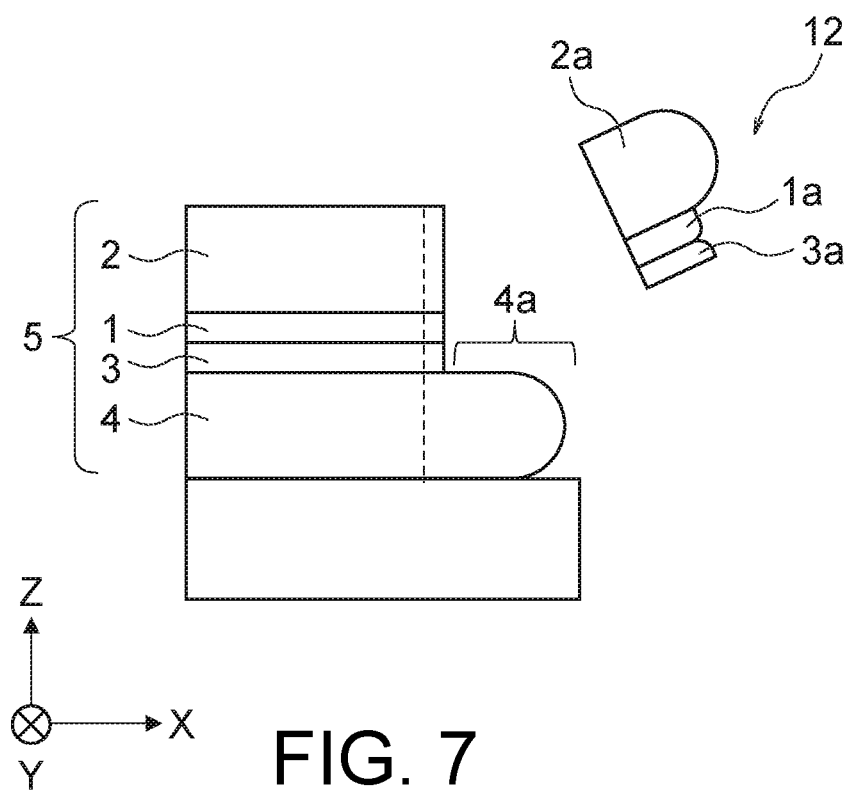
FIG. 7 is a schematic cross-sectional view illustrating an example of the manufacturing method of a semiconductor device in continuation from FIG. 6.

Next, the separating blade 11 in the form of a disk is inserted between the first substrate 2 and the second substrate 4 while being rotated in the direction of an arrow B to apply stress, as illustrated in FIG. 6. In this process, the modified layer 8 is broken in the outer circumferential portion of the first substrate 2, and the peeling layer 10 between the second substrate 4 and the material layer 3 is caused to peel. Accordingly, an outer circumferential portion 2a of the first substrate 2, an outer circumferential portion 1a of a material layer 1 on the first substrate 2, and an outer circumferential portion 3a of the material layer 3 on the second substrate 4 are separated and removed from the bonded substrate 5, as illustrated in FIG. 7. At this time, the outer circumferential portion 4a of the second substrate 4 is left as it is, whereas the outer circumferential portions 1a and 3a of the material layers 1 and 3 located thereon are entirely or at least partially removed. That is, an insulating film (for example, a silicon oxide film, a silicon nitride film, a silicon carbide film, or a silicon carbonitride film) and a wiring structure included in the material layers 1 and 3 are removed together with the outer circumferential portion of the first substrate 2 in the outer circumferential portion of the bonded substrate 5.

Next, the second robot 17 picks up the bonded substrate 5 from the third stage 27 and places it on the fourth stage 29 of the cleaning unit 22. In the cleaning unit 22, the two-fluid cleaning mechanism 30 cleans the bonded substrate 5. Thereafter, the fourth stage 29 is rotated, and the bonded substrate 5 is dried.

Subsequently, the second robot 17 picks up the bonded substrate 5 from the fourth stage 29 and places it on the standby port 15 in FIG. 1. The first robot 16 returns the bonded substrate 5 from the standby port 15 to the wafer case 14.

The peeling layer 10 is formed after the modified layer 8 is formed in the present embodiment. However, the modified layer 8 may be formed after the peeling layer 10 is formed. That is, the first laser emitter 24 emits the first laser beam 7 to the bonded substrate 5 and thereafter the second laser emitter 26 emits the second laser beam 9 to the bonded substrate 5 in the present embodiment. However, this order may be reversed in such a manner that the first laser emitter 24 emits the first laser beam 7 to the bonded substrate 5 after the second laser emitter 26 emits the second laser beam 9 to the bonded substrate 5.

Thereafter, the first substrate 2 is polished (subjected to backgrinding) in a polishing process. Further, the second substrate 4 is also polished after the outer circumferential portion 4a of the second substrate 4 is removed. Accordingly, a semiconductor device is formed in which the material layer 1 and the material layer 3 are bonded to each other. The bonded substrate 5 is subjected to dicing to be separated into a plurality of semiconductor chips. The device layer (for example, the memory cell array) in the material layer 1 and the device layer (for example, a CMOS circuit) in the material layer 3 are electrically connected to each other at a bonded surface between the material layer 1 and the material layer 3.

As described above, according to the present embodiment, the first laser beam 7 is emitted from the first substrate 2 side of the bonded substrate 5 to form the modified layer 8 extending in the Z-direction within the outer circumferential portion of the first substrate 2. Thereafter, the second laser beam 9 is emitted from the second substrate 4 side to form the peeling layer 10 extending in the X- or Y-direction between the second substrate 4 and the material layer 3 or between films in the material layer 3. Subsequently, the outer circumferential portion 2a of the first substrate 2 is separated from the modified layer 8, and the outer circumferential portion 1a of the material layer 1 and the outer circumferential portion 3a of the material layer 3 are at least partially separated from the second substrate 4 along the peeling layer 10. Accordingly, it is possible to remove not only the first substrate 2 but also a material layer, such as a device layer and an insulating film, from the outer circumferential portion of the bonded substrate 5. That is, the outer circumferential portion of the first substrate 2 and the material layers between the first substrate 2 and the second substrate 4 are removed from the outer circumferential portion of the bonded substrate 5 beforehand. Therefore, it is possible to prevent chipping of the outer circumferential portion of the bonded substrate 5 or dust generated from the outer circumferential portion of the bonded substrate 5 in subsequent processes such as a grinding process and a CMP process.

Further, according to the present embodiment, the second laser beam 9 is emitted from the second substrate 4 side opposite to the first substrate 2 side from which the first laser beam 7 is emitted. Although an insulating film, for example, a silicon oxide film having a thickness of 50 nm or more is provided on a surface of the second substrate 4, a device layer, such as a semiconductor element, is not provided on that surface. Therefore, the second laser beam 9 is absorbed by the material layer 3 and heats the material layer 3. Accordingly, the material layer 3 can easily peel off the surface of the second substrate 4 or peeling between films in the material layer 3 can easily occur. Consequently, the peeling layer 10 can be easily formed between the material layer 3 and the second substrate 4 or between the films in the material layer 3, so that the outer circumferential portion of the first substrate 2 and the material layers between the first substrate 2 and the second substrate 4 can be easily removed from the outer circumferential portion of the bonded substrate 5.

Second Embodiment

Figure 8:
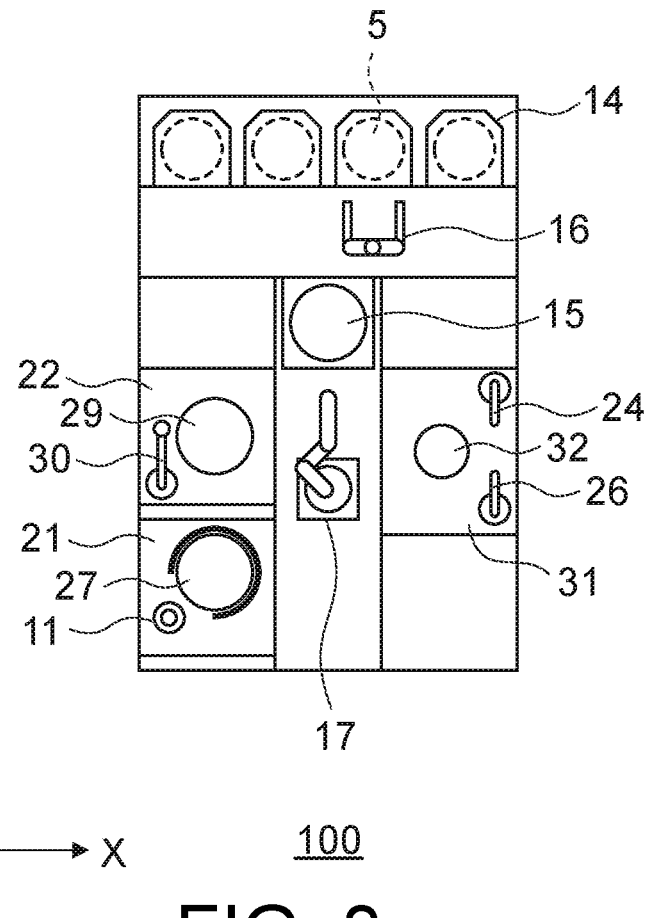
FIG. 8 is a plan view illustrating a configuration example of a semiconductor manufacturing device according to a second embodiment.
Figure 9:
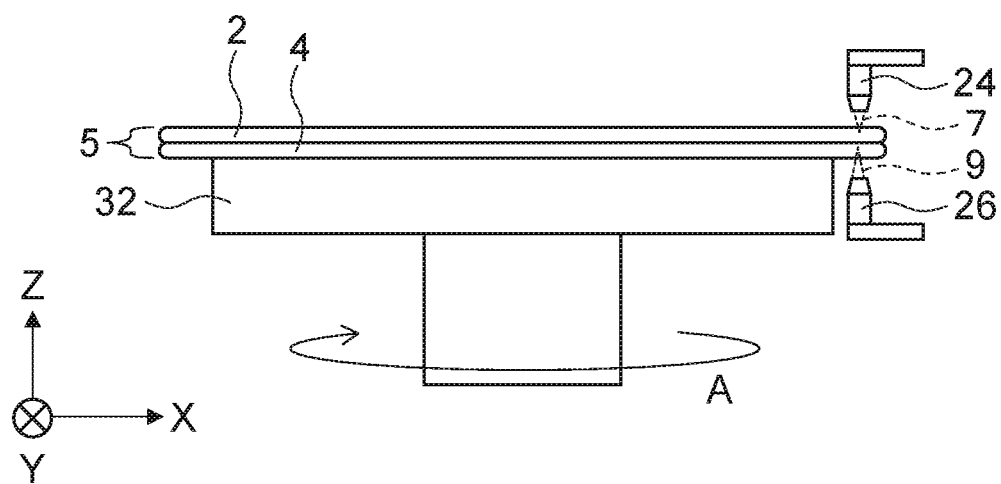
FIG. 9 is a schematic cross-sectional view illustrating a configuration example of a modified-layer-and-peeling-layer forming unit.

FIG. 8 is a plan view illustrating a configuration example of the semiconductor manufacturing device 100 according to a second embodiment. FIG. 9 is a schematic cross-sectional view illustrating a configuration example of a modified-layer-and-peeling-layer forming unit 31. According to the second embodiment, the second robot 17 does not include the inverting mechanism 18, and the modified-layer forming unit 19 and the peeling-layer forming unit 20 are configured as the single common modified-layer-and-peeling-layer forming unit 31. That is, the modified layer 8 and the peeling layer 10 are formed in the bonded substrate 5 continuously or simultaneously in the modified-layer-and-peeling-layer forming unit 31 without inverting the bonded substrate 5 in the second embodiment.

The modified-layer-and-peeling-layer forming unit 31 includes a stage 32, the first laser emitter 24, and the second laser emitter 26.

The stage 32 is configured to be able to hold the bonded substrate 5 and turn about a shaft as illustrated with the arrow A. The first laser emitter 24 is configured to be movable to the outer circumferential portion of the bonded substrate 5 and emits the first laser beam 7 to the outer circumferential portion of the bonded substrate 5 from above the bonded substrate 5 in the Z-direction, as described above. The second laser emitter 26 is configured to be movable to the outer circumferential portion of the bonded substrate 5 and emits the second laser beam 9 to the outer circumferential portion of the bonded substrate 5 from below the bonded substrate 5 in the Z-direction.

The stage 32 has a smaller diameter than the diameter of the bonded substrate 5 and holds the bonded substrate 5 in such a manner that the entire outer circumferential portion of the bonded substrate 5 protrudes outward from the outer edge of the stage 32. For example, the outer diameter of the bonded substrate 5 is about 300 mm, and the outer diameter of the stage 32 is about 280 mm. In this case, the outer circumferential portion of the bonded substrate 5 protrudes outward by about 20 mm from the stage 32. Accordingly, the first and second laser emitters 24 and 26 can respectively emit the first and second laser beams 7 and 9 to a front surface and a back surface of the bonded substrate 5 from opposite directions to each other, while the bonded substrate 5 is held on the same stage 32.

The first laser emitter 24 emits the first laser beam 7 from the first substrate 2 side of the bonded substrate 5. The second laser emitter 26 emits the second laser beam 9 from the second substrate 4 side of the bonded substrate 5.

The first and second laser emitters 24 and 26 may emit the first and second laser beams 7 and 9 to substantially the same position in an X-Y plane. That is, the first and second laser emitters 24 and 26 may be opposed to each other and almost overlap each other as viewed from the Z-direction. However, the first and second laser emitters 24 and 26 do not always have to emit the first and second laser beams 7 and 9 to substantially the same position in an X-Y plane. The first and second laser emitters 24 and 26 may emit the beams to positions displaced from each other in a circumferential direction of the bonded substrate 5. Even in a case where the first and second laser emitters 24 and 26 are arranged to be displaced from each other in the circumferential direction of the bonded substrate 5, the modified layer 8 and the peeling layer 10 are consequently formed in the outer circumferential portion of the bonded substrate 5 because the stage 32 rotates the bonded substrate 5 in the direction of the arrow A.

The first and second laser emitters 24 and 26 may emit the first and second laser beams 7 and 9 to the bonded substrate 5 simultaneously. In this case, the modified layer 8 and the peeling layer 10 are formed simultaneously in the outer circumferential portion of the bonded substrate 5. Therefore, the modified layer 8 and the peeling layer 10 can be formed in a short time. Meanwhile, the first and second laser emitters 24 and 26 may emit the first and second laser beams 7 and 9 to the bonded substrate 5 at different timings. For example, first, the first laser emitter 24 emits the first laser beam 7 to the outer circumferential portion of the bonded substrate 5 to form the modified layer 8 in the bonded substrate 5, as will be described later. Subsequently (continuously), the second laser emitter 26 may emit the second laser beam 9 to the outer circumferential portion of the bonded substrate 5 to form the peeling layer 10 in the bonded substrate 5.

The bonded substrate 5 may be placed upside down on the stage 32, and in accordance with the bonded substrate 5, the positions of the first laser emitter 24 and the second laser emitter 26 may be reversed. Also in this arrangement, the first laser beam 7 is emitted from the first substrate 2 side, so that the modified layer 8 can be formed within the first substrate 2. The second laser beam 9 is emitted from the second substrate 4 side, so that peeling can be caused to occur between the second substrate 4 and the material layer 3 or between films in the material layer 3 to form the peeling layer 10.

The inverting mechanism 18 is not required in the second embodiment. Therefore, it is possible to suppress the cost of the device 100 to be low. The modified-layer forming unit 19 and the peeling-layer forming unit 20 are made common as the single modified-layer-and-peeling-layer forming unit 31. Therefore, it is possible to further suppress the cost of the device 100 and to downscale the whole device 100. Other configurations in the second embodiment may be identical to corresponding ones in the first embodiment. Therefore, the second embodiment can also obtain identical effects to those of the first embodiment.

Figure 10:
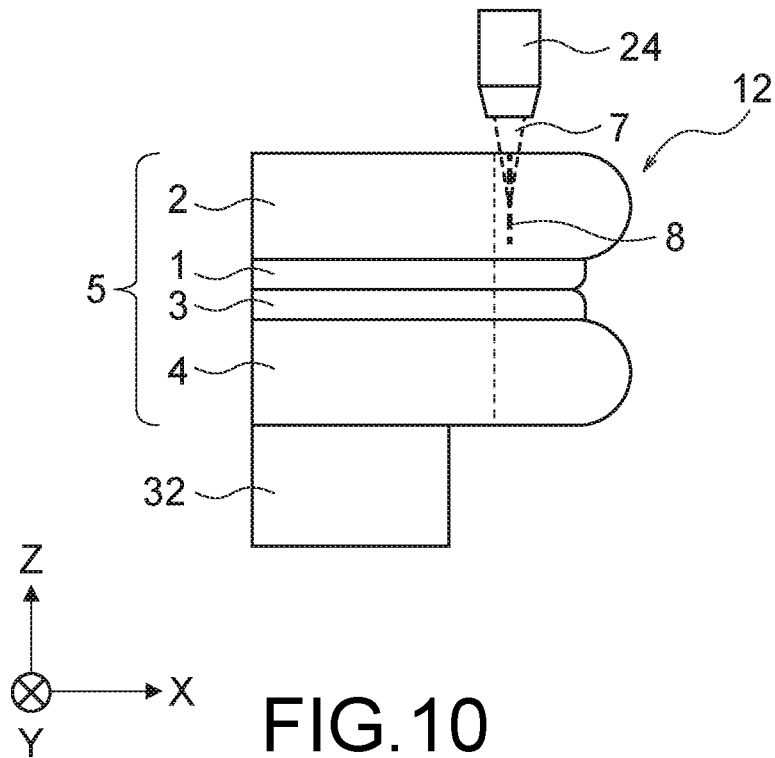
FIG. 10 is a schematic cross-sectional view illustrating an example of a manufacturing method of a semiconductor device according to the second embodiment.
Figure 11:
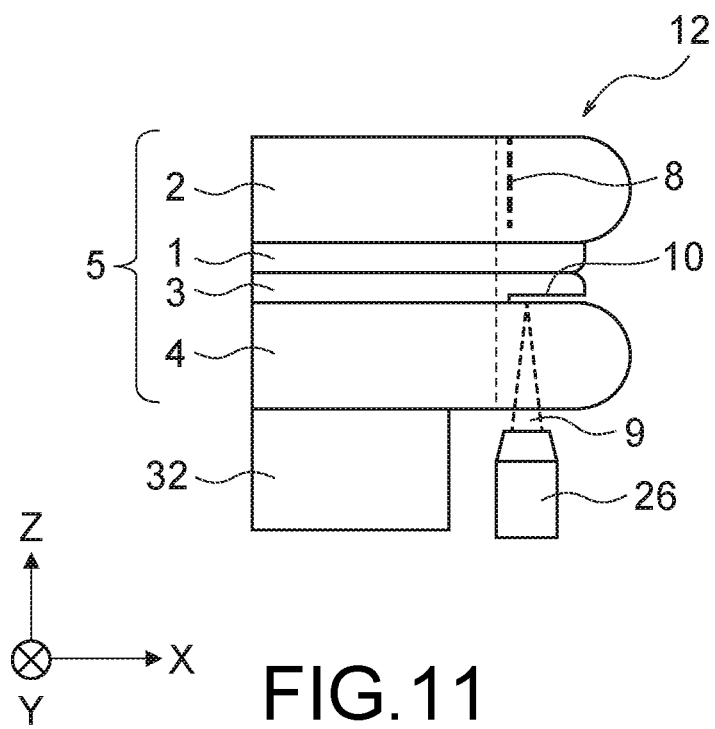
FIG. 11 is a schematic cross-sectional view illustrating an example of the manufacturing method of a semiconductor device in continuation from FIG. 10.

FIGS. 10 and 11 are schematic cross-sectional views illustrating an example of a manufacturing method of a semiconductor device according to the second embodiment.

First, the first robot 16 of the semiconductor manufacturing device 100 in FIG. 8 takes out the bonded substrate 5 from the wafer case 14 and places it on the standby port 15. The second robot 17 then places the bonded substrate 5 on the stage 32 of the modified-layer-and-peeling-layer forming unit 31 from the standby port 15. The bonded substrate 5 is placed on the stage 32 with the first substrate 2 facing up in the Z-direction. In the modified-layer-and-peeling-layer forming unit 31, the stage 32 holds the bonded substrate 5 with the first substrate 2 facing up in the Z-direction, as illustrated in FIG. 10. The stage 32 has a smaller diameter than the diameter of the bonded substrate 5. Therefore, the first and second laser emitters 24 and 26 can respectively emit the first and second laser beams 7 and 9 to the outer circumferential portion of the bonded substrate 5, which protrudes outward from the outer edge of the stage 32, from the opposite directions to each other.

Next, the first laser emitter 24 emits the first laser beam 7 to the outer circumferential portion of the first substrate 2 from the first substrate 2 side to form the modified layer 8 within the first substrate 2, as illustrated in FIG. 10. The modified layer 8 is formed to extend in a thickness direction of the first substrate 2 (the Z-direction).

At this time, the first stage 23 rotates the bonded substrate 5 in the direction of the arrow A in FIG. 9, whereby the modified layer 8 is formed within the first substrate 2 over the entire outer circumferential portion of the first substrate 2.

Next, while the bonded substrate 5 is placed on the stage 32, the second laser emitter 26 emits the second laser beam 9 from the second substrate 4 side. The second laser emitter 26 emits the second laser beam 9 to the material layer 3 arranged between the first substrate 2 and the second substrate 4 and provided on the second substrate 4 from the second substrate 4 side. Accordingly, the material layer 3 on the second substrate 4 is caused to absorb the second laser beam 9 to be heated, so that peeling is caused to occur between the second substrate 4 and the material layer 3 or between films in the material layer 3 to form the peeling layer 10.

Thereafter, by the processes that have been described with reference to FIGS. 6 and 7, a portion of an outer circumferential portion 12 (the outer circumferential portion 2a of the first substrate 2, the outer circumferential portion 1a of the material layer 1 on the first substrate 2, and the outer circumferential portion 3a of the material layer 3 on the second substrate 4) is separated and removed from the bonded substrate 5. Accordingly, the second embodiment can obtain the identical effects to those of the first embodiment.

The bonded substrate 5 may be placed upside down on the stage 32, and in accordance with the bonded substrate 5, the positions of the first laser emitter 24 and the second laser emitter 26 may be reversed. Also in this arrangement, the first laser beam 7 is emitted from the first substrate 2 side, and the modified layer 8 can be formed within the first substrate 2. The second laser beam 9 is emitted from the second substrate 4 side, and peeling can be caused to occur between the second substrate 4 and the material layer 3 or between films in the material layer 3 to form the peeling layer 10.

In a case of emitting the first and second laser beams 7 and 9 at different timings, the second laser emitter 26 may emit the second laser beam 9 to the bonded substrate 5 after the first laser emitter 24 emits the first laser beam 7 to the bonded substrate 5. However, this order may be reversed. That is, the first laser emitter 24 may emit the first laser beam 7 to the bonded substrate 5 after the second laser emitter 26 emits the second laser beam 9 to the bonded substrate 5.

The first and second laser emitters 24 and 26 may emit the first and second laser beams 7 and 9 to the bonded substrate 5 simultaneously. Emission performed in this manner shortens a time required for forming the modified layer 8 and the peeling layer 10.

In addition, the process of inverting the bonded substrate 5 is not required in the second embodiment. Therefore, the time required for forming the modified layer 8 and the peeling layer 10 is further shortened.

Third Embodiment

FIGS. 12 to 30 are schematic cross-sectional views illustrating an example of a manufacturing method of a semiconductor device according to a third embodiment. The third embodiment corresponds to an embodiment in which the first or second embodiment is applied to a memory chip. FIGS. 12 to 28 mainly illustrate processes of manufacturing the structure of the outer circumferential portion of the second substrate 4.

In the third embodiment, it is preferable that the material layer 3 on the second substrate 4 is an insulating film that does not have a device layer, such as a semiconductor element, provided on a surface of the second substrate 4. For example, in a case where the material layer 3 is a silicon oxide film, the thickness of the material layer 3 is preferably 50 nm or more. With this configuration, the second laser beam 9 can be absorbed in the material layer 3 more easily without being reflected by the device layer, so that the peeling layer 10 in FIG. 11 can be formed between the material layer 3 and the second substrate 4 or between films in the material layer 3 more easily. That is, the material layer 3 can effectively serve as an absorption layer for the second laser beam 9. The material layer 3 may include an upper-layer wiring structure provided above the second substrate 4. This is because the second laser beam 9 can be sufficiently absorbed by the material layer 3 (for example, a silicon oxide film) between the upper-layer wiring structure and the second substrate 4. A manufacturing method of a semiconductor device is described below.

Figure 12:
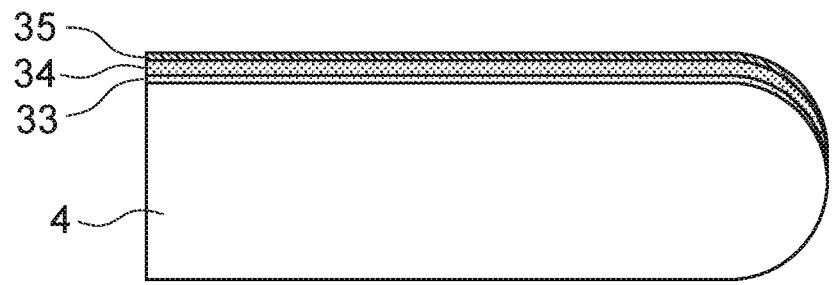
FIG. 12 is a schematic cross-sectional view illustrating an example of a manufacturing method of a semiconductor device according to a third embodiment.

First, a gate insulating film (for example, a silicon oxide film) 33, a gate electrode film (for example, a polysilicon film) 34, and an insulating film (for example, a silicon nitride film) 35 are stacked on the second substrate 4 (for example, a silicon substrate) in that order, as illustrated in FIG. 12. The thickness of the gate insulating film 33 is, for example, about 10 nm, the thickness of the gate electrode film 34 is, for example, about 90 nm, and the thickness of the insulating film 35 is, for example, about 30 nm.

Figure 13:
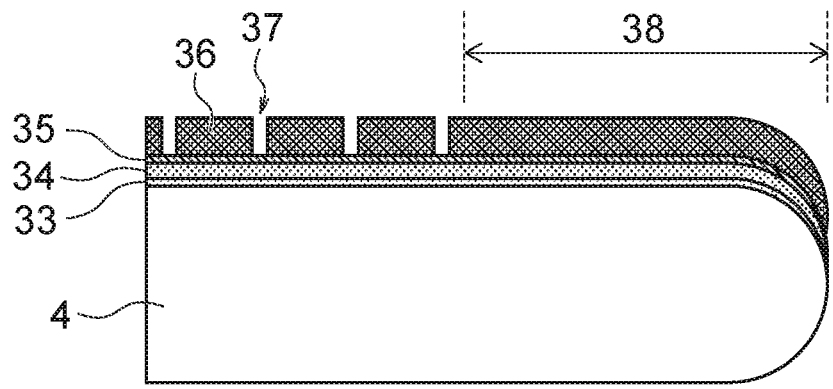
FIG. 13 is a schematic cross-sectional view illustrating an example of the manufacturing method of a semiconductor device in continuation from FIG. 12.

Next, a resist film 36 is applied on the insulating film 35 by lithography, and the resist film 36 in an element isolation formation region 37 is removed, as illustrated in FIG. 13. In this process, the resist film 36 is left on the outer circumferential portion (a material layer formation region) 38 of the second substrate 4.

Figure 14:
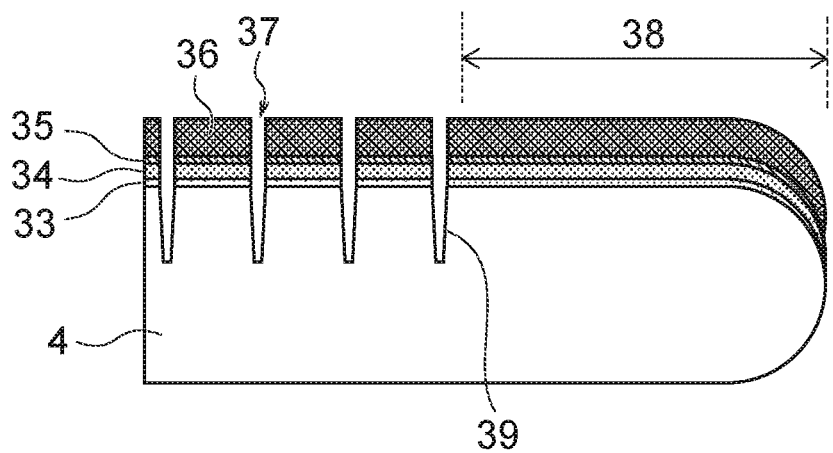
FIG. 14 is a schematic cross-sectional view illustrating an example of the manufacturing method of a semiconductor device in continuation from FIG. 13.

Next, the insulating film 35, the gate electrode film 34, the gate insulating film 33, and the second substrate 4 are processed by etching, for example, RIE (Reactive Ion Etching) using the resist film 36 as a mask, as illustrated in FIG. 14. In this manner, a trench 39 is formed in the element isolation formation region 37. The depth of the trench 39 is, for example, about 350 nm.

Figure 15:
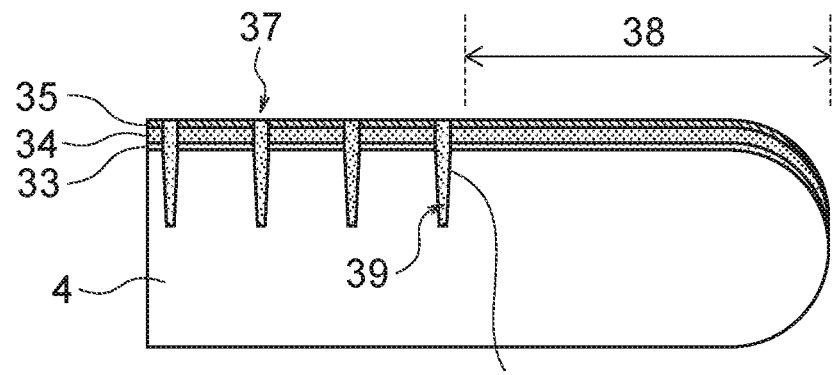
FIG. 15 is a schematic cross-sectional view illustrating an example of the manufacturing method of a semiconductor device in continuation from FIG. 14.

After the resist film 36 is removed, an insulating film (for example, a silicon oxide film) is deposited in the trench 39 and is polished by CMP (Chemical Mechanical Polishing). In this manner, the insulating film is embedded in the trench 39, so that an element isolating structure 40 is formed, as illustrated in FIG. 15. At this time, the element isolating structure 40 is not formed in the outer circumferential portion (the material layer formation region) 38 of the second substrate 4. Therefore, peeling can occur between the material layer 3 that is formed in the subsequent process and the second substrate 4 more easily, and the peeling layer 10 can be formed more easily.

Figure 16:
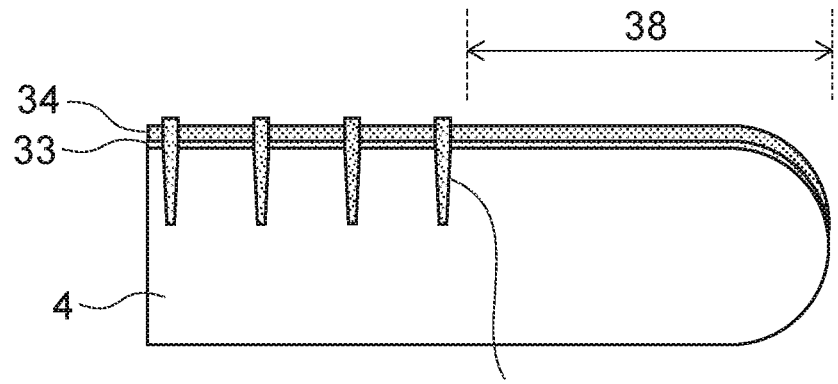
FIG. 16 is a schematic cross-sectional view illustrating an example of the manufacturing method of a semiconductor device in continuation from FIG. 15.
Figure 17:
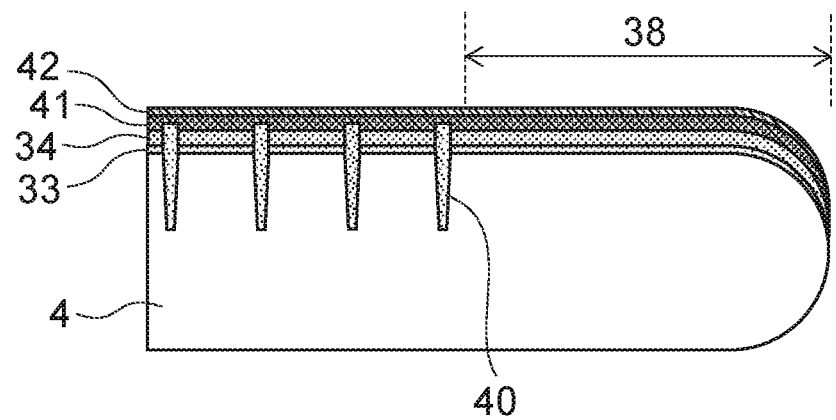
FIG. 17 is a schematic cross-sectional view illustrating an example of the manufacturing method of a semiconductor device in continuation from FIG. 16.

Next, the insulating film 35 is removed, as illustrated in FIG. 16. A metal silicide film (for example, a tungsten silicide (WSi) film) 41 and a cap insulating film (for example, a silicon nitride film) 42 are then stacked on the gate electrode film 34, as illustrated in FIG. 17. The metal silicide film 41 is processed later together with the gate electrode film 34 as a gate electrode. The thickness of the metal silicide film 41 is, for example, 90 nm. The thickness of the cap insulating film 42 is, for example, 50 nm.

Figure 18:
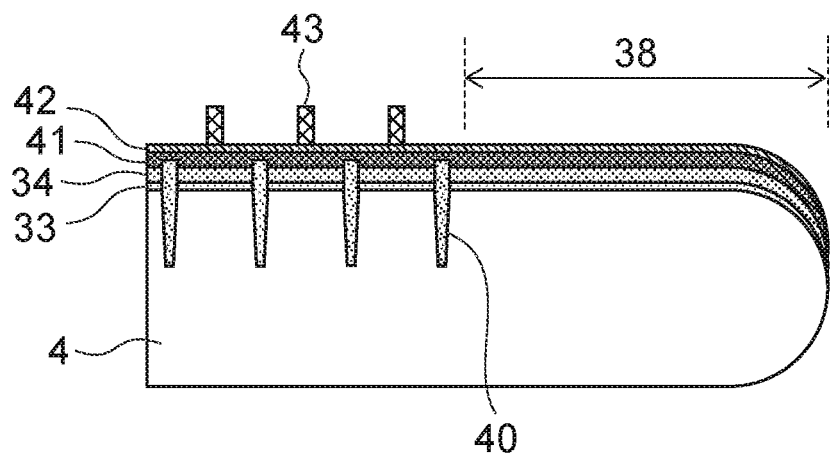
FIG. 18 is a schematic cross-sectional view illustrating an example of the manufacturing method of a semiconductor device in continuation from FIG. 17.

Next, a resist film 43 is applied on the cap insulating film 42 by lithography, and the resist film 43 in a region other than a gate-electrode formation region is removed. In this manner, the resist film 43 is processed in a pattern of a gate electrode of a transistor that configures a CMOS circuit, as illustrated in FIG. 18. In this process, the resist film 43 on the outer circumferential portion (the material layer formation region) 38 of the second substrate 4 is also removed.

Figure 19:
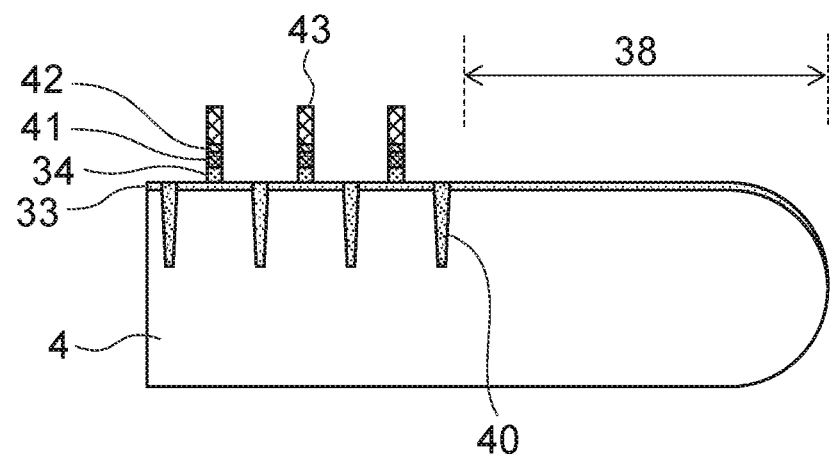
FIG. 19 is a schematic cross-sectional view illustrating an example of the manufacturing method of a semiconductor device in continuation from FIG. 18.

Next, the cap insulating film 42, the metal silicide film 41, and the gate electrode film 34 are processed in the pattern of the gate electrode by etching, for example, RIE using the resist film 43 as a mask, as illustrated in FIG. 19. Accordingly, the metal silicide film 41 and the gate electrode film 34 are formed as the gate electrode. The metal silicide film 41 and the gate electrode film 34 are also called gate electrodes 34 and 41 collectively in the following descriptions.

Figure 20:
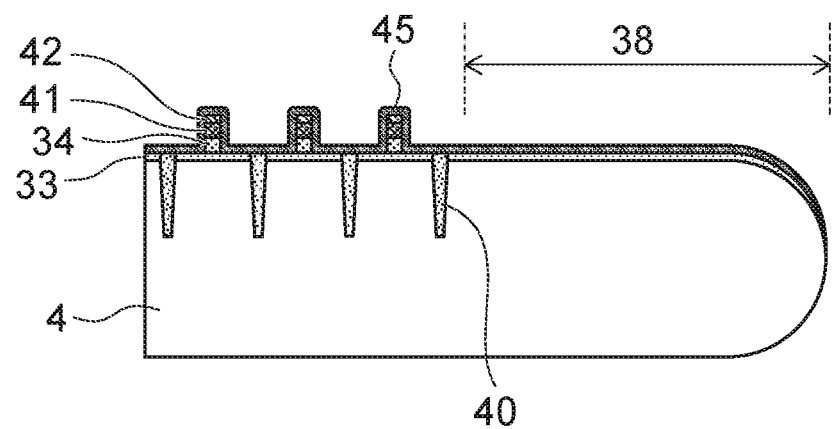
FIG. 20 is a schematic cross-sectional view illustrating an example of the manufacturing method of a semiconductor device in continuation from FIG. 19.

After the resist film 43 is removed, a material (for example, silicon oxide) for a spacer layer 45 is deposited above the second substrate 4, as illustrated in FIG. 20. The thickness of the material for the spacer layer 45 is, for example, 40 nm.

Figure 21:
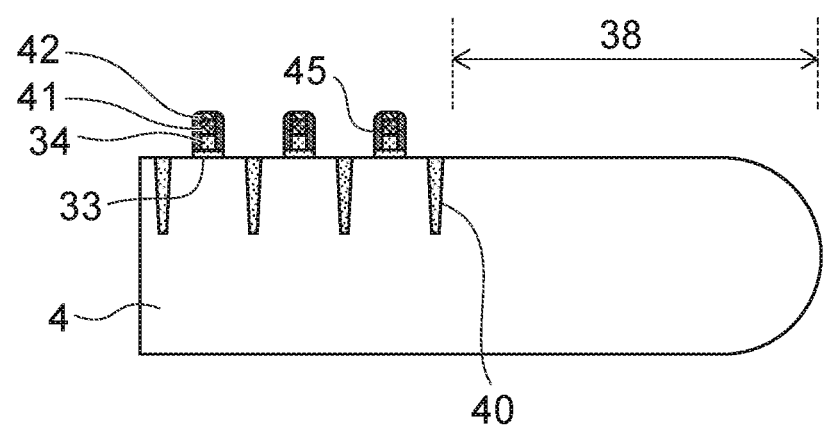
FIG. 21 is a schematic cross-sectional view illustrating an example of the manufacturing method of a semiconductor device in continuation from FIG. 20.

The material for the spacer layer 45 is then etched back, so that the spacer layer 45 is left on the side surfaces of the gate electrodes 34 and 41, as illustrated in FIG. 21. Subsequently, the material for the gate insulating film 33 is processed by etching using the cap insulating film 42 and the spacer layer 45 as masks. By this process, the gate insulating film 33 is left under the gate electrodes 34 and 41 and the spacer layer 45, as illustrated in FIG. 21. In this process, a device structure, such as the gate electrodes 34 and 41, is not formed on the outer circumferential portion (the material layer formation region) 38.

Next, impurities are introduced using the spacer layer 45 and the cap insulating film 42 as masks, whereby a source-drain layer (not illustrated) is formed.

Figure 22:
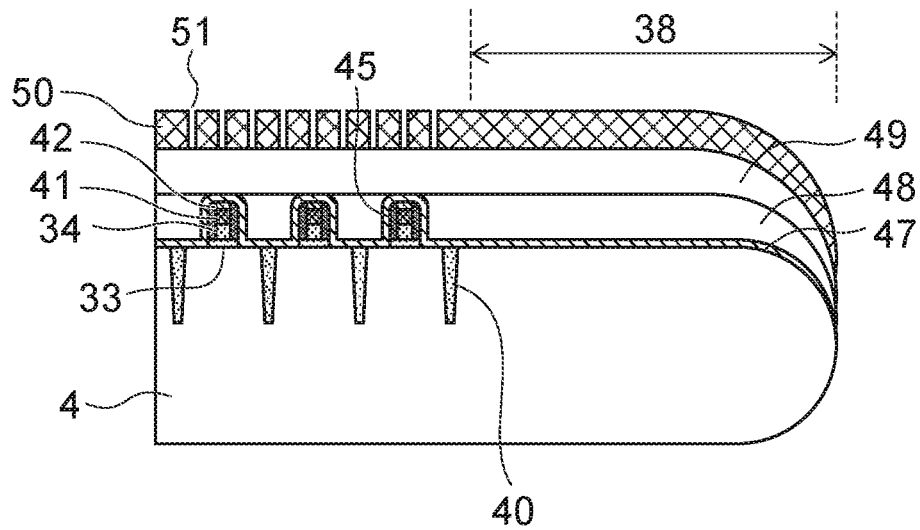
FIG. 22 is a schematic cross-sectional view illustrating an example of the manufacturing method of a semiconductor device in continuation from FIG. 21.

Next, insulating films 47 and 48 are stacked above the second substrate 4, as illustrated in FIG. 22. For example, a silicon nitride film is used as the insulating film (a liner layer) 47. The thickness of the insulating film 47 is, for example, about 30 nm. For example, a silicon oxide film is used as the insulating film 48. The thickness of the insulating film 48 is, for example, about 500 nm.

Next, the insulating film 48 is flattened by CMP or the like, and thereafter an insulating film 49 is deposited on the insulating film 48. For example, a silicon oxide film is used as the insulating film 49. The thickness of the insulating film 49 is, for example, about 200 nm.

Next, a resist film 50 is applied on the insulating film 49 by lithography, and the resist film 50 in a contact formation region 51 is removed, as illustrated in FIG. 22. In this process, the resist film 50 on the outer circumferential portion (the material layer formation region) 38 is left.

Figure 23:
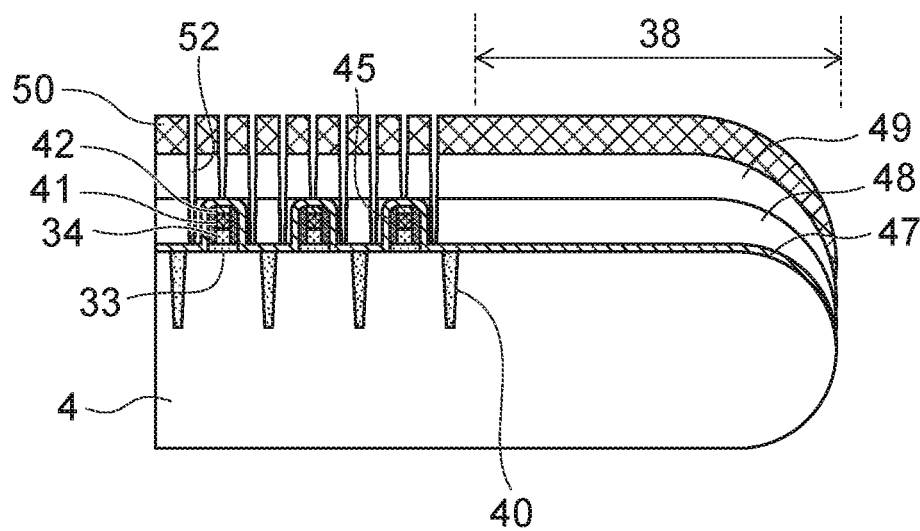
FIG. 23 is a schematic cross-sectional view illustrating an example of the manufacturing method of a semiconductor device in continuation from FIG. 22.
Figure 24:
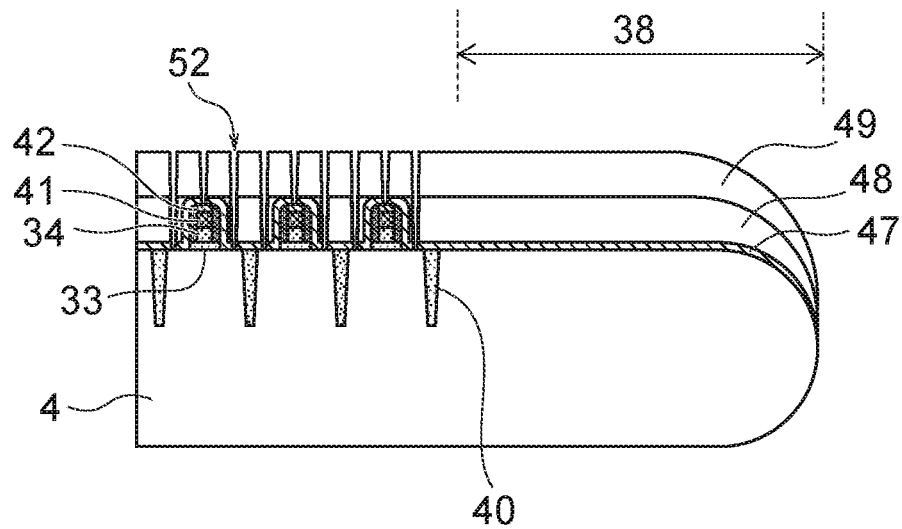
FIG. 24 is a schematic cross-sectional view illustrating an example of the manufacturing method of a semiconductor device in continuation from FIG. 23.

Next, the insulating films 49 and 48 are processed by etching, for example, RIE using the resist film 50 as a mask to form a contact hole 52, as illustrated in FIG. 23. After the resist film 50 is removed, the insulating film 47 and the cap insulating film 42 on the bottom of the contact hole 52 are further etched by, for example, RIE using the insulating film 49 as a mask. By this process, the contact hole 52 reaches the second substrate 4 or the gate electrodes 34 and 41, as illustrated in FIG. 23. The structure illustrated in FIG. 24 is obtained by removing the resist film 50.

Figure 25:
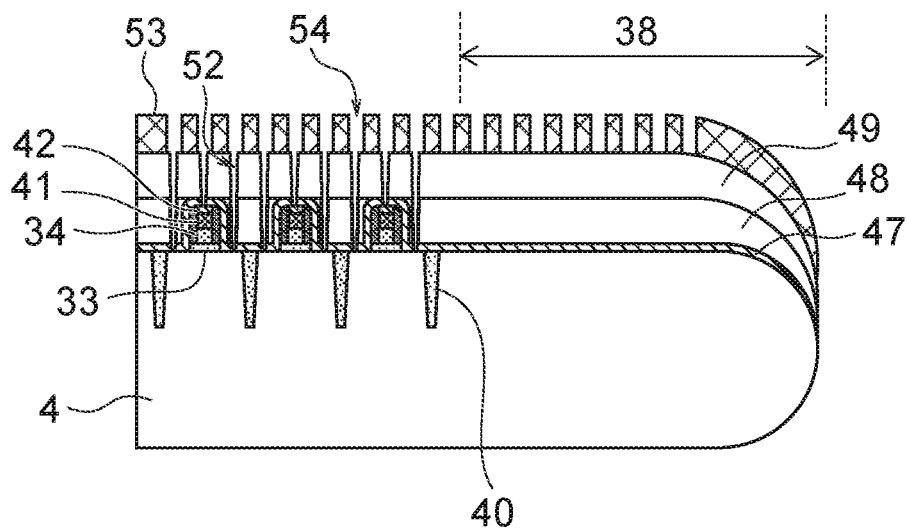
FIG. 25 is a schematic cross-sectional view illustrating an example of the manufacturing method of a semiconductor device in continuation from FIG. 24.

Next, a resist film 53 is applied by lithography, and the resist film 53 in a wiring formation region 54 is removed, as illustrated in FIG. 25.

Figure 26:
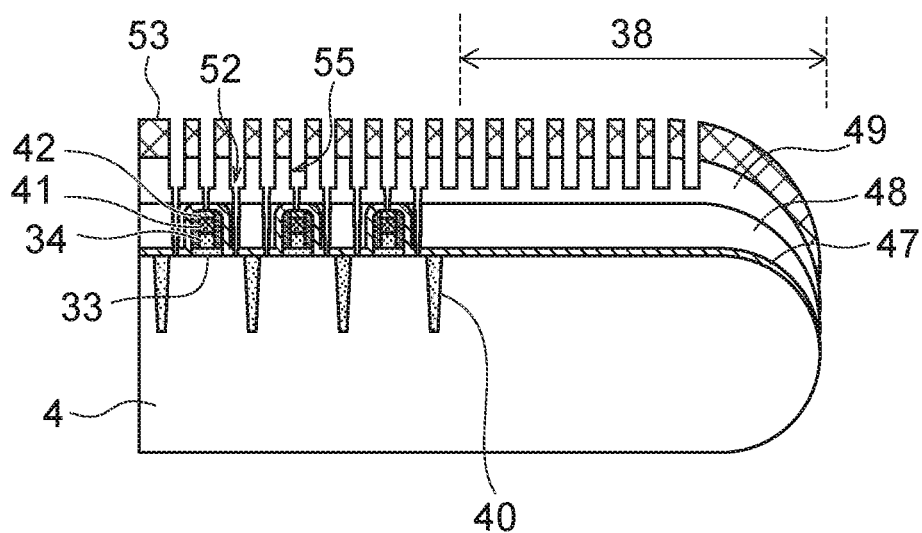
FIG. 26 is a schematic cross-sectional view illustrating an example of the manufacturing method of a semiconductor device in continuation from FIG. 25.

Next, an upper portion of the insulating film 49 (for example, a portion of 100 nm length from the top surface of the insulating film 49) is processed by etching, for example, RIE using the resist film 53 as a mask to form a trench 55, as illustrated in FIG. 26. The trench 55 passes above the contact hole 52 and extends in a direction perpendicular to the diagram of FIG. 26, for example.

Figure 27:
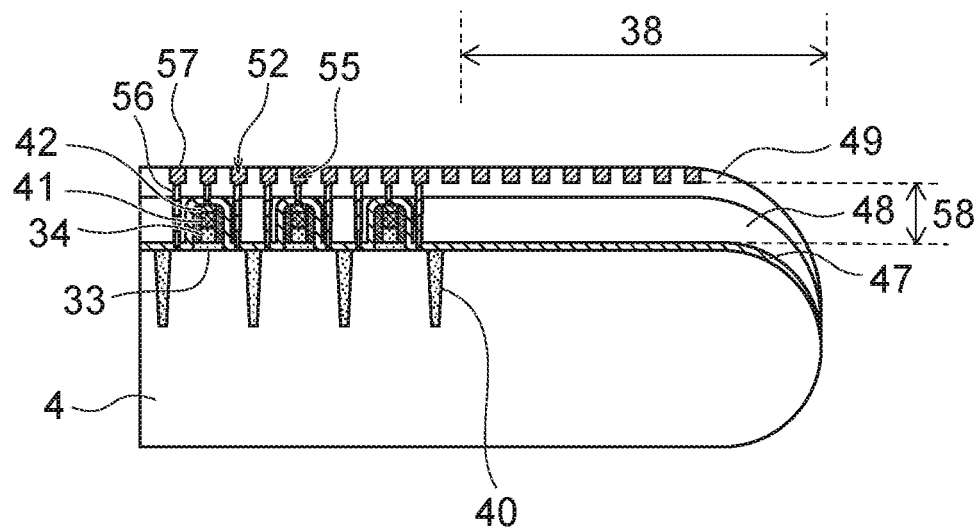
FIG. 27 is a schematic cross-sectional view illustrating an example of the manufacturing method of a semiconductor device in continuation from FIG. 26.

After the resist film 53 is removed, a metal film (for example, a tungsten film) is formed to be embedded in the contact hole 52 and the trench 55. The metal film is then polished by CMP until a surface of the insulating film 49 is exposed. Accordingly, a contact 56 and a wiring layer 57 are formed, as illustrated in FIG. 27. At this time, in the outer circumferential portion (the material layer formation region) 38, a region 58 of the insulating films 48 and 49 on the second substrate 4, in which the wiring layer 57 is not provided, serves as a material layer (an absorbing layer) that absorbs the second laser beam 9. The thickness of the absorbing layer 58 is, for example, 340 nm. Only the liner layer 47 is present between the absorbing layer 58 and the second substrate 4.

Figure 28:
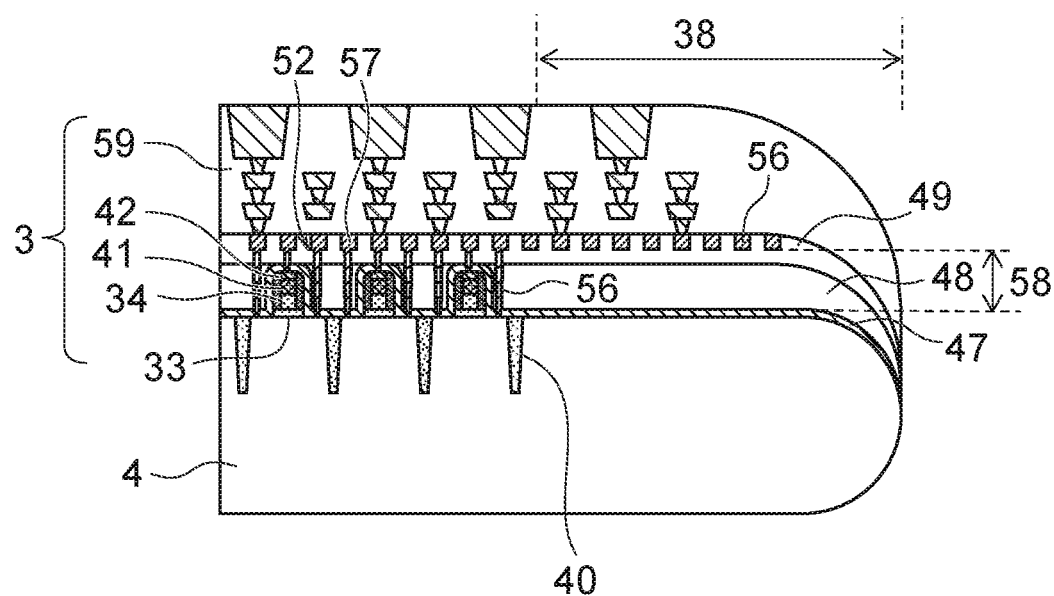
FIG. 28 is a schematic cross-sectional view illustrating an example of the manufacturing method of a semiconductor device in continuation from FIG. 27.

Next, an upper-layer wiring structure 59 is formed on the insulating film 49 and the wiring layer 57, as illustrated in FIG. 28.

As described above, the material layer 3 is formed on the second substrate 4. The material layer 3 has a device layer (the gate insulating film 33, the gate electrode 34, and the metal silicide film 41) that configures a CMOS circuit in a center region of the second substrate 4. Meanwhile, in the outer circumferential portion 38, the material layer 3 does not include the device layer, and the insulating films 47 to 49, the wiring layer 57, and the upper-layer wiring structure 59 are formed. In particular, not only the device layer but also the wiring layer 57 and the upper-layer wiring structure 59 are not provided on the absorbing layer 58 of the material layer 3 which is located right above the second substrate 4. Accordingly, the absorbing layer 58 can efficiently absorb the second laser beam 9, as long as it is formed by an insulating film, such as a silicon oxide film, having a relatively large thickness of 50 nm or more.

Aside from the second substrate 4, the material layer 1 is formed on the first substrate 2. The material layer 1 includes a memory cell array 60 and an upper-layer wiring structure 61. The reason for this configuration will be described later. The detailed description of a process of forming the material layer 1 is omitted here.

Figure 29:
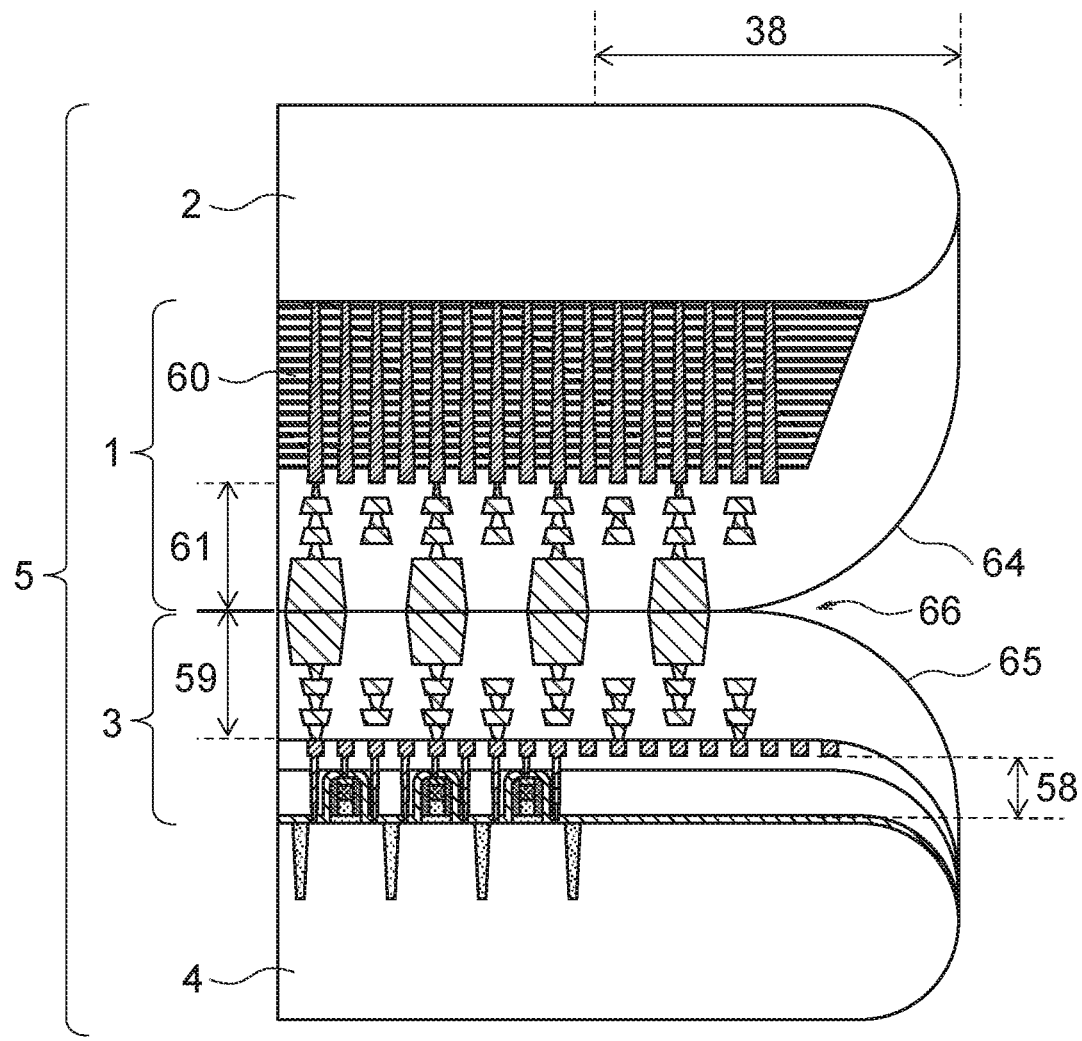
FIG. 29 is a schematic cross-sectional view illustrating an example of the manufacturing method of a semiconductor device in continuation from FIG. 28.

The first substrate 2 and the second substrate 4 are bonded to each other at bonded surfaces 64 and 65, as illustrated in FIG. 29. A wiring layer of the upper-layer wiring structure 61 of the first substrate 2 is exposed in the bonded surface 64. A wiring layer of the upper-layer wiring structure 59 of the second substrate 4 is exposed in the bonded surface 65. When the bonded surfaces 64 and 65 are bonded to each other, the wiring layer of the upper-layer wiring structure 61 and the wiring layer of the upper-layer wiring structure 59 are bonded to each other. Accordingly, the memory cell array 60 of the first substrate 2 and the CMOS circuit of the second substrate 4 are electrically connected to each other. The bonded substrate 5 is formed by bonding the first substrate 2 and the second substrate 4 to each other.

At this time, the outer edges of the first and second substrates 2 and 4 are rounded with a certain curvature. The outer circumferential portion 38 of each of the material layers 1 and 3 has an unbonded region (a roll-off region) 66 because of the round portion of the outer edge of each of the first and second substrates 2 and 4, overpolishing by CMP, and the like. Therefore, the unbonded region 66 that is not bonded at the bonded surface is generated in the outer circumferential portion 38. In order to remove this unbonded region 66, a subsequent trimming process is performed.

Next, the laser trimming process is performed in accordance with the first or second embodiment. For example, the first laser emitter 24 emits the first laser beam 7 from the first substrate 2 side to form the modified layer 8 in the outer circumferential portion 38 of the first substrate 2. The second laser emitter 26 emits the second laser beam 9 from the second substrate 4 side to form the peeling layer 10 between the second substrate 4 and the absorbing layer 58 in the material layer 3. Thereafter, the separating blade 11 is inserted between the first substrate 2 and the second substrate 4 to apply stress, thereby causing fracture in the modified layer 8 and the peeling layer 10. The first substrate 2 and the material layers 1 and 3 are separated in the outer circumferential portion 38. Accordingly, although the outer circumferential portion of the second substrate 4 is left, the first substrate 2 and the material layers 1 and 3 in the outer circumferential portion 38 are removed from the bonded substrate 5.

Figure 30:
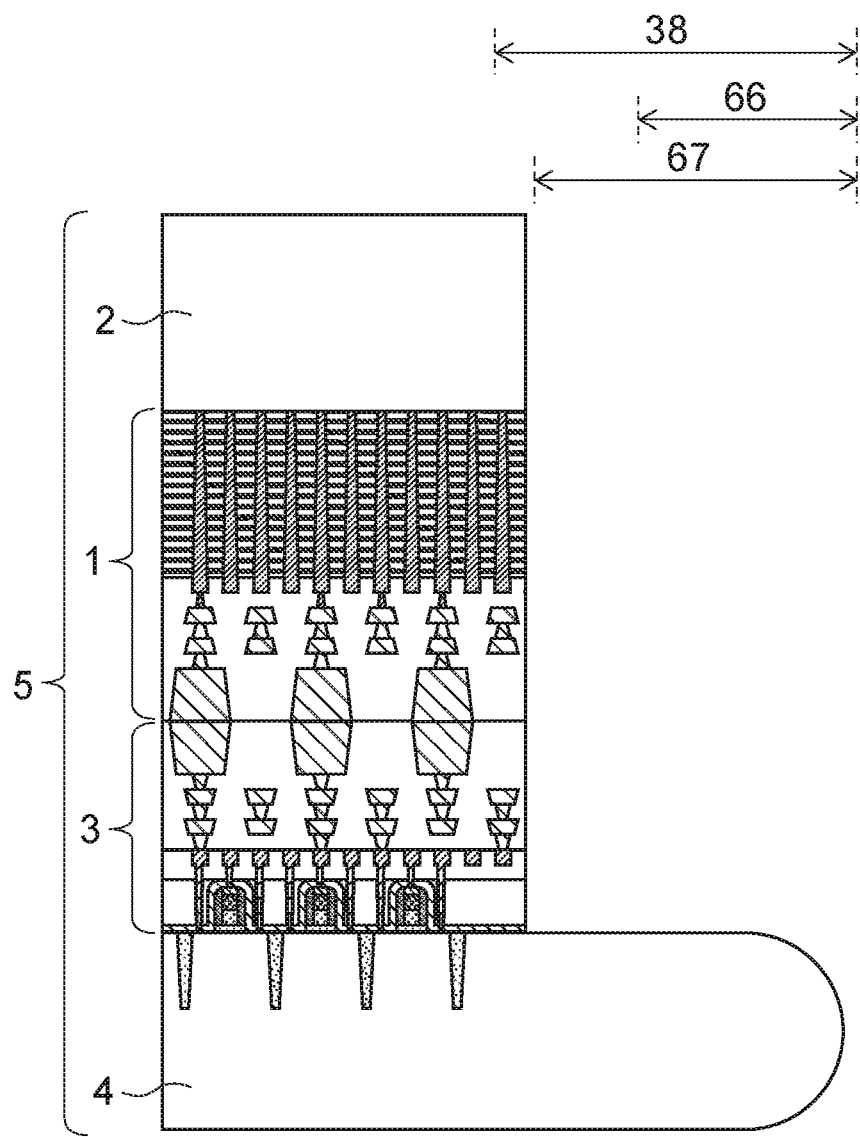
FIG. 30 is a schematic cross-sectional view illustrating an example of the manufacturing method of a semiconductor device in continuation from FIG. 29.

A trimmed region 67 removed by trimming includes the round portions at the outer edges of the first and second substrates 2 and 4 and the unbonded regions 66 and is set in a region included in the outer circumferential portion 38. That is, the length of the trimmed region 67 is longer than that of the unbonded region 66 and is shorter than that of the outer circumferential portion 38 in the X-direction (the radial direction of the bonded substrate 5), as illustrated in FIG. 30. For example, the round portions of the first and second substrates 2 and 4 and the unbonded region 66 correspond to a region from the outer edge of the bonded substrate 5 to about 2.0 mm inside the outer edge. The outer circumferential portion (the material layer formation region) 38 corresponds to a region from the outer edge of the bonded substrate 5 to 3.0 mm inside the outer edge. The trimmed region 67 corresponds to a region from the outer edge of the bonded substrate 5 to 2.5 mm inside the outer edge.

Thereafter, although not illustrated in the drawings, the first substrate 2 is made thin by a grinding process and a CMP process, an electrode is then formed, and a semiconductor device structure is formed thereon in some cases. Since the material layers 1 and 3 in the outer circumferential portion 38 are removed in the trimming process, it is possible to prevent chipping and generation of dust in the grinding process and the CMP process.

In addition, the element isolating structure 40 is not provided in the outer circumferential portion 38 of the second substrate 4. Accordingly, peeling can occur at the interface between the second substrate 4 and the material layer 3 more easily, and the peeling layer 10 can be formed easily. Therefore, it is possible to prevent the material layers 1 and 3 from being left in the trimmed region 67.

Further, the absorbing layer 58 not including the device layer and the wiring layer (that is, the insulating films 48 and 49) is provided in the material layer in the outer circumferential portion 38. In this manner, it is possible to increase efficiency of absorption of the second laser beam 9 and promote formation of the peeling layer 10. Accordingly, it is possible to prevent the material layers 1 and 3 from being left in the trimmed region 67.

In order to achieve absorption of energy required for formation of the peeling layer 10, the thickness of the absorbing layer 58 is preferably 50 nm or more. It is preferable that a film reflecting the second laser beam 9, for example, a metal film is not present between the second substrate 4 and the absorbing layer 58. In addition, it is preferable that no pattern is formed in the absorbing layer 58 and between the second substrate 4 and the absorbing layer 58 in order to prevent scattering of the second laser beam 9. That is, the absorbing layer 58 is preferably formed by a single-layer film or a multilayer film that is flat along the surface of the second substrate 4. The absorbing layer 58 is preferably made of a material that enables simultaneous formation of the absorbing layer 58 and an interlayer dielectric film of a semiconductor structure in order to simplify manufacturing processes. For example, it is preferable that the absorbing layer 58 (that is, the insulating films 48 and 49) is made of a material such as silicon oxide, silicon nitride, silicon carbide, or silicon carbonitride.

Further, it is preferable that the absorbing layer 58 is provided on the second substrate 4 on which a CMOS circuit is formed in the present embodiment. In a case where the absorbing layer 58 is provided on the first substrate 2 having the three-dimensional memory cell array 60, it is necessary to remove the memory cell array in the outer circumferential portion 38. In this case, a large step of 1 μm or more is formed at the boundary between the outer circumferential portion 38 and the memory cell array 60, and the unbonded region (the roll-off region) 66 becomes wider because of overpolishing in the CMP process or the like. As a result, there is a possibility that the trimmed region 67 has to be expanded. Therefore, it is preferable that the absorbing layer 58 is provided on the second substrate 4. Also, it is preferable that the second laser beam 9 is emitted from the second substrate 4 side.

The embodiment described above can also be applied to a CMOS (Complementary Metal Oxide Semiconductor) image sensor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing device comprising:
a first laser emitter configured to emit, in an outer circumferential portion of a bonded substrate including a first substrate and a second substrate bonded to each other, a first laser beam into the first substrate from a side of the first substrate to form a modified layer;
a second laser emitter configured to emit a second laser beam to a material layer from a side of the second substrate to cause peeling between the second substrate and the material layer, the material layer being arranged between the first substrate and the second substrate and being provided on the second substrate;
a separating portion configured to separate an outer circumferential portion of the first substrate and an outer circumferential portion of the material layer from the outer circumferential portion of the bonded substrate;
a stage configured to hold the bonded substrate; and
an inverting portion configured to invert the bonded substrate, wherein
the first and second laser emitters emit the first and second laser beams to the bonded substrate from a same direction as each other.

2. The device of claim 1, wherein the first laser emitter emits the first laser beam to the outer circumferential portion of the first substrate, and
the second laser emitter emits the second laser beam to the material layer after the inverting portion inverts the bonded substrate and places the bonded substrate on the stage.

3. A semiconductor manufacturing device comprising:
a first laser emitter configured to emit, in an outer circumferential portion of a bonded substrate including a first substrate and a second substrate bonded to each other, a first laser beam into the first substrate from a side of the first substrate to form a modified layer;
a second laser emitter configured to emit a second laser beam to a material layer from a side of the second substrate, to cause peeling between the second substrate and the material layer, the material layer being arranged between the first substrate and the second substrate and being provided on the second substrate;
a separating portion configured to separate an outer circumferential portion of the first substrate and an outer circumferential portion of the material layer from the outer circumferential portion of the bonded substrate,
wherein the first and second laser emitters emit the first and second laser beams to the bonded substrate from opposite directions to each other.

4. The device of claim 3, further comprising a stage having a smaller diameter than a diameter of the bonded substrate and configured to hold the bonded substrate.

5. The device of claim 3, wherein the first and second laser emitters emit the first and second laser beams to the bonded substrate simultaneously.

6. A manufacturing method of a semiconductor device using a semiconductor manufacturing device that includes a first laser emitter configured to emit a first laser beam to an outer circumferential portion of a bonded substrate including a first substrate and a second substrate bonded to each other, a second laser emitter configured to emit a second laser beam to the outer circumferential portion of the bonded substrate, a separating portion configured to cause separation in the outer circumferential portion of the bonded substrate, and an inverting portion configured to invert the bonded substrate, the method comprising:
emitting, in the outer circumferential portion of the bonded substrate, the first laser beam into the first substrate to form a modified layer;
emitting the second laser beam to a material layer arranged between the first substrate and the second substrate and provided on the second substrate, to cause peeling between the second substrate and the material layer; and
separating an outer circumferential portion of the first substrate and an outer circumferential portion of the material layer from the outer circumferential portion of the bonded substrate, wherein
the method further comprises inverting the bonded substrate after emission of the first laser beam and before emission of the second laser beam or after emission of the second laser beam and before emission of the first laser beam.

7. The method of claim 6, wherein the semiconductor manufacturing device further includes a stage having a smaller diameter than a diameter of the bonded substrate, and
the first and second laser emitters emit the first and second laser beams to the outer circumferential portion of the bonded substrate, which protrudes outward from an outer edge of the stage, from opposite directions to each other.

8. The method of claim 6, wherein a thickness of the material layer provided on the second substrate is 50 nm or more.

9. The method of claim 6, wherein the material layer is any one of a silicon oxide film, a silicon nitride film, a silicon carbide film, and a silicon carbonitride film.

10. The method of claim 6, wherein a memory cell array is provided on the first substrate, and
a CMOS (Complementary Metal Oxide Semiconductor) transistor is provided on the second substrate.

11. The method of claim 6, wherein any element isolating structure is not provided in an outer circumferential portion of the second substrate on which the material layer is provided.

12. The method of claim 6, wherein any device layer that reflects the second laser beam is not provided in the material layer.

* * * * *